United States Patent

Detweiler, Jr. et al.

[15] 3,640,738

[45] Feb. 8, 1972

[54] BOROSILICATE GLASS COMPOSITION

[72] Inventors: John R. Detweiler, Jr.; Rao R. Tummala, both of Wappingers Falls, N.Y.

[73] Assignee: International Business Machines Corporation, Armonk, N.Y.

[22] Filed: Nov. 20, 1970

[21] Appl. No.: 91,599

[52] U.S. Cl. ....106/54, 106/46

[51] Int. Cl. ....C03c 3/04

[58] Field of Search ....106/54, 39 DV, 48, 46; 317/258; 117/125

[56] References Cited

UNITED STATES PATENTS 2,478,626 8/1949 Grigorieff ....106/54

3,408,222 10/1968 Nayias ....106/54 R 3,420,685 1/1969 Martin ....106/54

*Primary Examiner*—Daniel E. Wyman

*Assistant Examiner*—W. R. Satterfield

*Attorney*—Hanifin and Jancin and Wolmar J. Stoffel

[57] ABSTRACT

A glass composition particularly adapted for use with ceramic materials in electronic module applications having a thermal coefficient of expansion substantially matching the thermal coefficient of expansion of ceramic material, and a low dielectric constant less than 4.5. The composition is a borosilicate glass consisting essentially of $SiO_2$, $B_2O_3$, CaO, $Al_2O_3$, $Na_2O$, $K_2O$, BaO, $ZrO_2$, and MgO in relatively precise amounts.

4 Claims, No Drawings

BOROSILICATE GLASS COMPOSITION

DISCUSSION OF THE PRIOR ART

The present invention relates generally to the glass making art and more particularly is concerned with a new glass composition tailored to meet critical physical, electrical, and chemical requirements in the electronic art.

The advent of integrated circuit devices has produced a great concentration in circuit densities. This increase in circuit densities has lead to a demand for improvement in establishing electrical contact between the integrated circuit device and associated devices and apparatus. In general, integrated circuit chips are supported on relatively large modules. The conductive metallurgy system of the module makes electrical contact with the closely spaced device terminals and the terminal structure of the module which is on a larger scale and far less dense than the device terminal structure. The support module has essentially the same number of terminals as the device in this particular packaging technique. The module is then mounted on an associated support, typically a card, having embodied thereon or associated therewith additional circuit structure.

In an effort to reduce the number of terminals on the module support, additional circuitry was placed on the module itself which ordinarily would have been associated with the module support, such as a card. This technique will effectively reduce the number of terminals on the module by consolidating the terminal outputs and inputs from the device into the module circuitry. For example, in semiconductor memory applications decoding circuits embodied within the module can effectively reduce the number of inputs necessary to locate the information in the memory array. Further, the conductor lengths to and from the associated circuits and in the associated circuits themselves are reduced thus increasing efficiency and speed and also the reliability. The packaging concept permits a plurality of devices to be mounted on a single module.

A specific example of the aforementioned packaging technique utilizes a thin ceramic substrate having a plurality of metallurgy stripe layers sandwiched between thin glass layers. One difficulty in fabricating such a structure is developing a glass which will meet the very demanding requirements of the application. The glass layer thickness is of the order of 1–2 mils in thickness and is ordinarily applied to the module in the form of a suspension of glass particles in an organic liquid. After applying the suspension layer, it is sintered. A sintering temperature must be low enough so that the metallurgy layers are not destroyed or impaired and must be high enough not to cause any movement of metal lines due to glass flow during pin brazing. Also the thermal coefficient of expansion of the sintered glass layer must substantially match the coefficient of expansion of the ceramic substrate so that following the sintering the glass will not crack, craze, or cause significant warpaging of the module. Another requirement is that the dielectric constant of the glass be relatively low in order that the capacitance between the metallurgy layers remains low. If the capacitance is increased substantially, the speed of the device module combination would be reduced limiting its usefulness, particularly in high-performance computer applications. Glass compositions known to the prior art do not meet all of the requirements, namely, a low sintering temperature, preferably below 800° C., a coefficient of expansion substantially matching the coefficient of expansion of a ceramic or more preferably slightly less so as to put the glass in compression, and a low dielectric constant preferably below 4.5.

While any or all of the foregoing properties may be obtained at the sacrifice of others by manipulating the various compositions in the glass formation, no known glass displays all of the above-mentioned properties.

DESCRIPTION OF THE PREFERRED EMBODIMENTS

In addition to the aforementioned requirements a glass used in the fabrication of a glass metal ceramic module must be resist to etchants used to etch away unwanted portions of the blanket metallurgy deposited on the glass layer. Such etchants are normally acids and alkalies. When the glass is not sufficiently resistant to the etchant the glass will deteriorate becoming porus, forming pin holes and present an uneven thickness since a portion will be normally etched away only over the areas underlying the metal to be removed. Another requirement is that the glass not contain ions which may migrate in an electrical field which would cause the disruptive influence in the relatively small circuit patterns. Since the thermal coefficient of expansion of ceramic is of the order of $68\times10^{-7}/^{\circ}$C. the glass must be a substantial match or preferably be $5-10\times10^{-7}/^{\circ}$C. lower so as to place the underlying glass in compression. Significant differences in the coefficients of expansion causes the substrate to be cambered which limits the number of multilevel glass metal layers, particularly as the size of the module is increased beyond 1 inch squared. Also, following the sintering operation, each glass layer must be lapped in order to produce an acceptable surface which will result in good adherence of the metal and the subsequent overlying glass layer. If the substrate is cambered, a significantly greater portion will be lapped from either the edges or the center. In extreme cases the entire glass thickness might be lapped away. In less extreme circumstances the thickness of the glass layer might be reduced in thickness so as to cause objectionable increases in parasitic capacitance between the metallurgy layers. Further, when fabrication of the module involves a pin brazing operation it is important that the pin brazing temperature be kept below 800° C. in order to avoid the flow of glass and therefore the movement of metal lines.

It has been discovered that by combining preselected amounts of oxides a glass composition can be formulated which will meet the demanding requirements for fabricating a glass metal ceramic module. The glass formulation and permissable ranges of its constituents are given in the following table:

TABLE

| Constituent | Amount (wt %) |
|---|---|
| $SiO_2$ | 59–61 |
| $B_2O_3$ | 25–32 |
| CaO | 1–2 |
| $Al_2O_3$ | 1–3 |
| $Na_2O$ | 2–3 |
| $K_2O$ | 2–4 |
| BaO | 1–3 |
| $ZrO_2$ t 0.25–0.75 | |
| MgO | 0.25–0.75 |

The above-listed constituents must be in the ranges cited. Any change in the amount of $SiO_2$ outside the specific range would significantly change the sintering temperature. $B_2O_3$ in amounts over 32 percent in the composition causes the resultant composition to loose chemical durability. Any amount under 25 percent increases the sintering temperature of the composition above the desired limit. In regard to CaO, more than 2 percent raises the sintering temperature while any amount less than 1 percent causes the composition to loose chemical durability. $Al_2O_3$ in an amount greater than 3 percent raises the sintering temperature point drastically, while any amount less than 1 percent causes the glass to crystallize. With NaO and $K_2O$ the amounts must not exceed 0.75 because this would unduly increase the amount of ion migration. Another requirement is that the ratio of $K_2O$ to $Na_2O$ must be approximately 1 for minimizing the ion migration. When the two oxides are present with each other, they have a blocking effect which results in minimizing ion migration. Less than 2 percent of $K_2O$ results in a high softening point while greater than 4 percent causes a lowering of the softening point. BaO in the composition improves the linear expansion.

However, this constituent in amounts greater than 3 percent will produce in the glass a high softening point or sintering temperature. MgO is needed for limiting phase separation. However, in amounts less than 0.25 percent the effect is not achieved. In amounts greater than 0.75 percent there is an objectionable increase in sintering temperature. $ZrO_2$ is provided for basically the same reason as MgO. However, in amounts over 0.75 percent no further beneficial effect results, but additional amounts will increase the softening point which is objectionable. In general all of the constituents with the exception of $B_2O_3$ increase the dielectric constant. However, the amount of $B_2O_3$ cannot exceed 32 percent because it results in a loss of chemical durability.

As will be appreciated the above glass composition represents a delicate and critical balance of a plurality of commonly known glass constituents which will produce the desired physical properties necessary in fabricating a glass metal ceramic module.

A preferred specific embodiment of the aforediscussed glass composition contains 60 percent $SiO_2$, 29 percent $B_2O_3$, 2 percent CaO, 1 percent $Al_2O_3$, 3 percent $Na_2O$, 1 percent BaO, 0.5 percent $ZrO_2$, 0.5 percent MgO. This composition has the following properties:

| | |
|---|---|
| Dielectric Constant | 4.4 at 1 mc. |
| Thermal Evaluation (At room temperature—set point) | $60\times10^{-7}$ per°C. |
| Softening Point | 741° C. |
| Sintering Temperature | 800° C. |
| Chemical Durability | 1.04 ml. |
| Resistivity | $10^{16}$ ohm—cm. |
| Density | 2.22 gm./cc. |
| Refractive Index | 1.51 |

When the glass of the subject invention is formulated with a $B_2O_3$ content in the high end of the range given above, a lowering of the dielectric constant will be realized. However, chemical durability and softening point will also be lowered. This can be compensated by including amounts of CaO+BaO in amounts in the higher end of the ranges set forth. This would, within limits, improve the dielectric constant and chemical durability of the glass while keeping the softening point on the order of 800° C. as required.

The aforedescribed glass composition, as well as other glasses, that are capable of phase separation can be strengthened very significantly by suitable heat treatment. It has been established that when a glass, for example, a borosilicate glass is heat treated at temperatures above 490°, or above the annealing point, there occurs a phase separation into two immiscible glass phases. The mechanism of phase separation is spinodal below about 650° C., while at high temperatures, nucleation and growth type of phase separation occurs. The micro structure of the spinodal separation is extremely connective and therefore strong, while that of the nucleation and growth of phase separation displays significantly less strength. The objective then of a heat treatment is to promote spinodal phase separation. When the aforedescribed glass composition is sintered and cooled relatively rapidly following the sintering operation a nucleation and growth type of phase separation is formed within the layer. However, if the glass layer is reheated to a temperature on the order of 600° C. for a time on the order of 5 hours, the spinodal phase separation occurs. Conversely, if the glass layer is heated to a temperature on the order of 750° C. for a time of the order of 5 hours, the nucleation and growth type of phase separation occurs. Thus, the suggested heat treatment for strengthening a glass that is capable of phase separating is to heat the composition at the temperature for forming spinodal phase growth for a time sufficient to promote the growth. The proper temperature for a specific glass composition can be determined from a phase diagram of the composition.

While the invention has been particularly shown and described with references to a preferred embodiment thereof it will be understood by those skilled in the art that various changes in form and detail may be made without departing from the spirit and scope of the invention.

What is claimed is:

1. A glass consisting essentially of the following constituents in the indicated proportions:

| | Percent by Weight |
|---|---|
| $SiO_2$ | 59–61 |
| $B_2O_3$ | 25–32 |
| CaO | 1–2 |
| $Al_2O_3$ | 1–3 |
| $Na_2O$ | 2–3 |
| $K_2O$ | 2–4 |
| BaO | 1–3 |
| $ZrO_2$ | 0.25–0.75 |
| MgO | 0.25–0.75 |

2. The composition of claim 1 wherein the $B_2O_3$ content is in the range of 25–27 percent by weight.

3. The composition of claim 1 wherein he $B_2O_3$ content is in the range of 28–30 percent by weight.

4. The composition of claim 1 wherein the $B_2O_3$ content is in the range of 30–32 percent by weight.

* * * * *